United States Patent [19]
Hsu et al.

[11] Patent Number: 5,889,727
[45] Date of Patent: Mar. 30, 1999

[54] CIRCUIT FOR REDUCING THE TRANSMISSION DELAY OF THE REDUNDANCY EVALUATION FOR SYNCHRONOUS DRAM

[75] Inventors: Peter K. Y. Hsu, Hsinchu; Jonathan Y. P. Chou, Taipei; Tsun-Chu Wu, Yi Lan, all of Taiwan

[73] Assignee: Texas Instruments—Acer Incorporated, Hsinchu, Taiwan

[21] Appl. No.: 75,758

[22] Filed: May 11, 1998

[51] Int. Cl.$^6$ .................................. G11C 8/00; G11C 7/00
[52] U.S. Cl. ............... 365/233; 365/230.08; 365/189.05; 365/200; 365/225.7
[58] Field of Search ............................... 365/233, 230.08, 365/189.05, 200, 225.7

[56] References Cited

U.S. PATENT DOCUMENTS

| | | | |
|---|---|---|---|
| 5,625,596 | 4/1997 | Uchida | 365/200 |
| 5,717,651 | 2/1998 | Kikukawa et al. | 365/233 |
| 5,732,030 | 3/1998 | Dorney | 365/200 |

*Primary Examiner*—David Nelms
*Assistant Examiner*—Trong Phan

*Attorney, Agent, or Firm*—Harness, Dickey & Pierce, P.L.C.

[57] ABSTRACT

The present invention discloses a circuit that reduces the transmission delay of the redundancy evaluation for SDRAM. After an input address is decoded as an external address, the external address is routed to a global factor generator to generate global factors accompanied with an address strobe pulse. The external address is also routed to a redundancy check circuit for starting the redundancy evaluation. Therefore, the redundancy evaluation can be performed as soon as the external address comes. While the external address comes, a column burst pulse and a system clock are directed to the internal counter of the global factor generator for counting continuously. The current count value is treated as an internal address and then routed to the redundancy check circuit to output the ready redundancy evaluation. After the redundancy evaluation and a column synchronous pulse generated by the global column factor generator come to a column redundancy latch, a signal that indicates whether a normal or a redundant memory cell is accessed is sent to a local column factor generator. Finally, a normal or a redundancy bit-line selector is generated to enable a read/write operation. Therefore, the transmission delay that is caused by awaiting the generation of the redundancy evaluation can be significantly reduced.

20 Claims, 6 Drawing Sheets

CIRCUIT FOR REDUCING THE TRANSMISSION DELAY OF THE REDUNDANCY EVALUATION FOR SYNCHRONOUS DRAM

BACKGROUND OF THE INVENTION

1. Field of the Invention

The present invention relates to a circuit with an improved transmission scheme, and more particularly to a circuit for reducing the transmission delay of redundancy evaluation of the synchronous DRAM (SDRAM).

2. Description of the Prior Art

Many kinds of electrical products are invented each day, and these new products usually need a higher processing speed than before. A key point for upgrading the processing speed is to effectively improve the access time from data storage, such as decreasing the transmission delay of the DRAM (Dynamic Random Access Memory) or of the SDRAM. In the present day, chip yield on the processed silicon wafer becomes an important topic when electronic devices are mass produced today. One typical evaluation for the chip yield is done with replacement of defective circuit elements. For example, redundant cells are inevitable in DRAM for replacing defective memory cells that are identified in an electrical test after wafer processing. However, the conventional scheme usually causes a significant delay due to identifying whether a redundant memory cell is used. This disadvantage turns out to be critical particularly for high-speed SDRAM design.

Referring to FIG. 1, which represents a block diagram illustrative of the conventional column redundancy scheme of the SDRAM circuit, an external address from an address buffer 101 is firstly decoded and is then routed to the global column factor generator 103. Accompanied with a column address strobe pulse (CASP) and a column burst pulse (COL_BURST) that passes through a NOR gate 102, the global column factor generator 103 generates a plurality of global column factors. The global column factors ("CF" for short hereinafter) are then directed to a local factor generator 105 that also generates several local column factors for controlling bit-line selector (YS) of several memory blocks (such as 4 or 8 blocks). On the other hand, the global column factors are also directed to a column redundancy check 104 for evaluating whether a redundant memory cell is needed when a column synchronous pulse (YPULSE) comes up. The column redundancy check 104 enables a normal column path enable signal (CYEN) to indicate that a normal memory cell is accessed. In other words, the column redundancy check 104 enables a redundancy column path enable signal (CRYEN) to indicate that a column redundant cell is used. Finally, the local CF generator 105 generates a normal bit-line selector (YS) or a redundancy bit-line selector (YSR) to enable a read/write operation to the SDRAM according to the CYEN and CRYEN. Clearly, the redundancy evaluation will not be performed until the global factors arrive at the column redundancy check 104.

FIG. 5 describes a waveform diagram illustrative of when an external address and a system clock (SYS_CLK) come to drive a read/write operation in the SDRAM circuit of the FIG. 1. Obviously, the CASP, the global CF, and the YPULSE appearing later than the SYS_CLK will start a memory read/write operation. A duration to perform a redundancy evaluation is indicated by τ, which is conventionally about 1~2 nanoseconds. This is an unacceptable value, especially for those high operation circuits. A need has therefore arisen to disclose a circuit, in which the transmission delay of column redundancy used in the SDRAM can be significantly reduced for achieving the requirement of high operation speed.

SUMMARY OF THE INVENTION

Accordingly, the present invention discloses a circuit that reduces the transmission delay of redundancy evaluation for the SDRAM. The circuit encompasses an address buffer for decoding an input address to be an external address. The external address is then routed to a global factor generator to generate global factors accompanied with an address strobe pulse. The external address is also routed to a redundancy check circuit that performs a redundancy evaluation. Accordingly, the redundancy check circuit performs the redundancy evaluation as soon as the external address comes. Simultaneously, when the external address comes a burst pulse and a system clock are directed to an internal counter of the global generator for counting continuously. The current count value is treated as an internal address and then routed to the redundancy check circuit to output the ready redundancy evaluation. When the redundancy evaluation and a synchronous pulse generated by the global factor generator arrive at a redundancy latch, a signal that indicates whether a normal or a redundant memory cell is accessed is sent to a local factor generator. Finally, a normal or a redundancy bit-line selector is generated to enable a read/write operation. Therefore, the transmission delay that is caused by awaiting the generation of the redundancy evaluation can be significantly reduced.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 2:
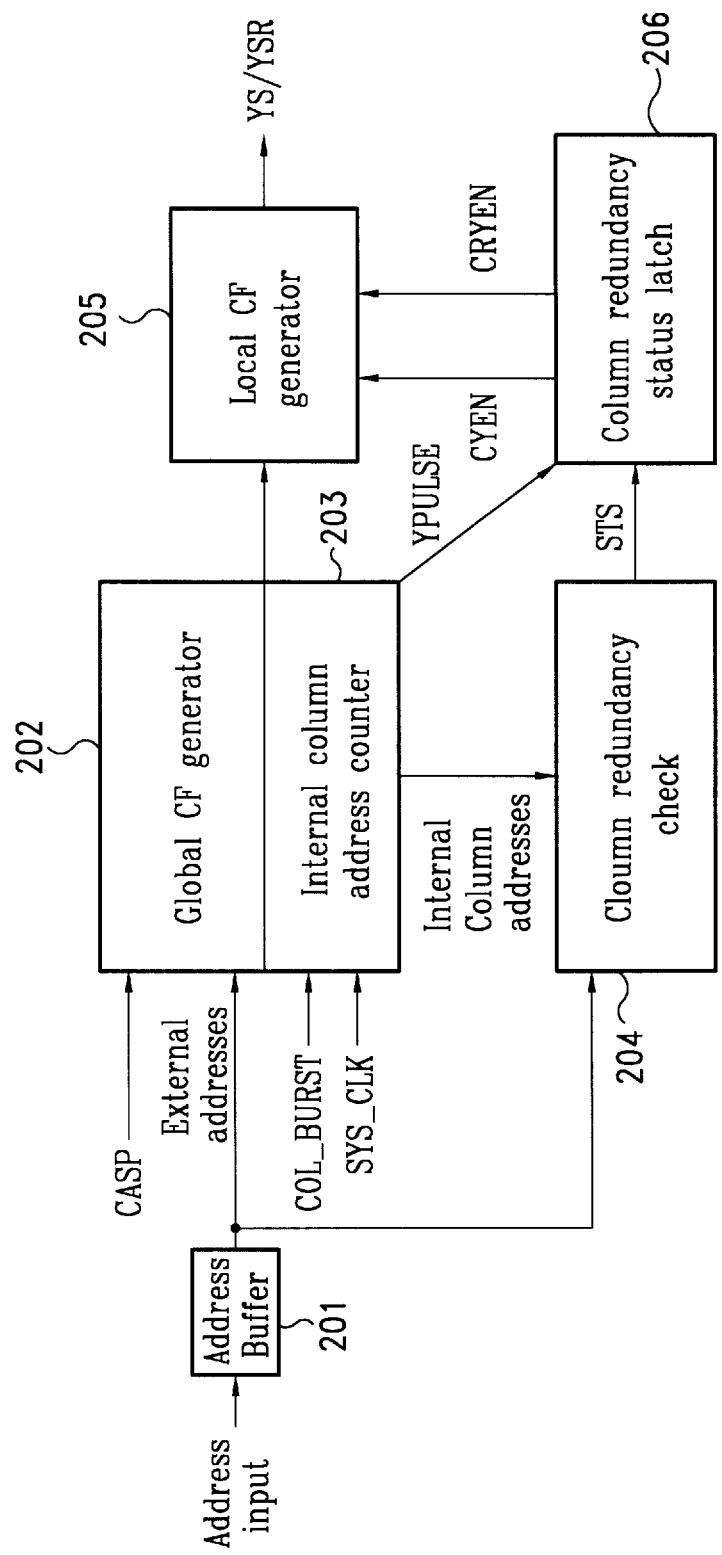
FIG. 2 shows a block diagram representative of the column redundancy scheme of the present invention.

FIG. 2 shows a block diagram representative of the preferred embodiment by using a column redundancy evaluation. Similar to the conventional SDRAM, the external addresses come from an address buffer 201 and are generated and routed to the global CF generator 202. Also, accompanied with a column address strobe pulse (CASP), the global CF generator 202 generates global column factors and then sends them to a local CF generator 205. A column burst pulse (COL_BURST) and a system clock (SYS_CLK) routed into the global CF generator 202 is used to enable the internal column address counter 203 for generating internal column addresses. On the other hand, the external addresses are also routed to a column redundancy check 204 to perform redundancy evaluation. While the internal column addresses from the internal column address counter 203 arrive, the column redundancy check 204 outputs a status (STS) treated as a redundancy evaluation result. When the STS and a column synchronous pulse (YPULSE) arrive at a column redundancy latch 206, a signal (CYEN or CRYEN) that indicates whether a normal or a redundant memory cell is accessed will be generated and sent to a local CF generator 205. Finally, the local CF generator 205 generates a normal bit-line selector (YS) or a redundancy bit-line selector (YSR) to enable a read/write operation to the SDRAM. Obviously, the redundancy evaluation can be performed when the external addresses come up without the necessity to wait for the global factors.

Figure 3A:
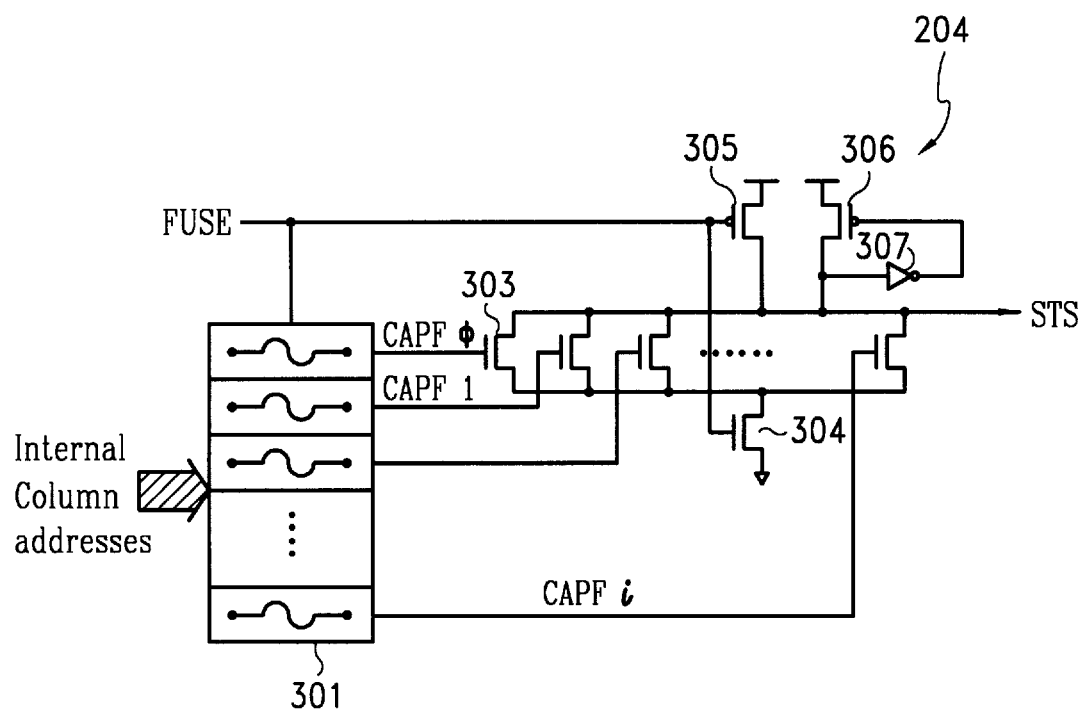
FIG. 3A is a diagram illustrative of the detailed circuit diagram of the column redundancy check in FIG. 2.

FIG. 3A describes a detailed circuit diagram illustrative of the configuration of the column redundancy check 204. Referring to FIG. 3A, a fuse set 301 is detected for performing the redundancy evaluation by using the internal column addresses and the fuse pre-charge signal (FUSE). Column address pulse factors (CAPF i indicating the redundant evaluation result) are then generated to indicate whether the fuse sets 301 are fusedly connected or blown. Each column address pulse factor is directed to the gate of the NMOS transistor 303. Please note that all drains of the NMOS transistors 303 are tied together, and the redundancy evaluation result (STS) is output from the drains of the NMOS transistors 303. In addition, all the sources of the NMOS transistors are coupled together and also coupled with the drain of an NMOS transistor 304. The gate of the NMOS transistor 304 is used to receive FUSE, and the source of the NMOS transistor 304 is connected with a voltage reference (usually connected with the ground). Furthermore, two PMOS transistors 305 and 306 are also employed to in the column redundancy check 204. Both the drains of the PMOS transistors 305 and 306 are coupled together, and also connected with the drains of the NMOS transistors 303. Moreover, both sources of the PMOS transistors 305 and 306 are connected with another reference voltage (usually a steady voltage source). The gate of the PMOS transistor 305 is used to receive FUSE; however, the gate of the PMOS transistor 306 is used to receive the inverted phase of STS (through an inverter 307).

Figure 3B:
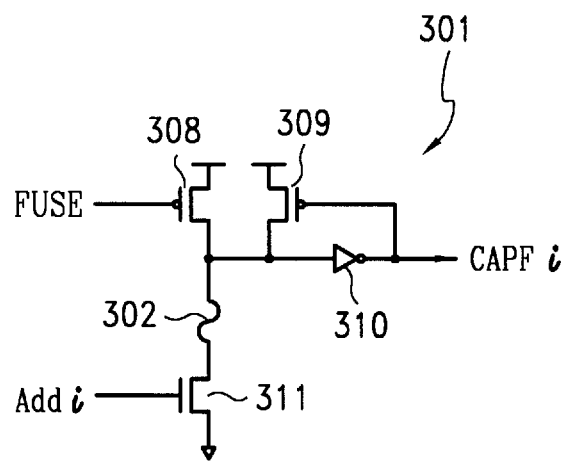
FIG. 3B depicts a diagram illustrative of the fuse set of the column redundancy check in the FIG. 3A.

Referring now to to FIG. 3B, illustration of the detailed circuit diagram of the fuse set forth in FIG. 3A is shown. Obviously, each fuse set is composed of two PMOS transistors 308 and 309, an NMOS transistor 311, an inverter 310, and a fuse 302. Both sources of the PMOS transistors 308 and 309 are connected with a steady voltage source, and both drains of the PMOS transistors 308 and 309 are coupled with one terminal of the fuse 302. The other terminal of the fuse 302 is connected with the drain of the NMOS transistor 311. Moreover, the gate and source of the NMOS transistor 311 are respectively coupled with the ground and the internal column address according the ith fuse set (Add i). The gate of the PMOS transistor 308 receives FUSE, and the gate of the PMOS transistor 309 receives a feedback signal of CAPF i. As noted, the logic-state of the CAPF i is the inverted phase of the drains of the PMOS transistors 308 and 309. The fuse 302 is fusedly connected or blown and can be applied to indicate the logic-state of the fuse set 301. For example, the CAPF i will output a signal '1' as a response to the external address when the fuse 302 is fusedly connected. In addition, the CAPF i will be '0' if the fuse 302 is fusedly blown. Thus, the STS '0' or '1' will respectively indicate that a normal or a redundant memory cell is selected.

Figure 4:
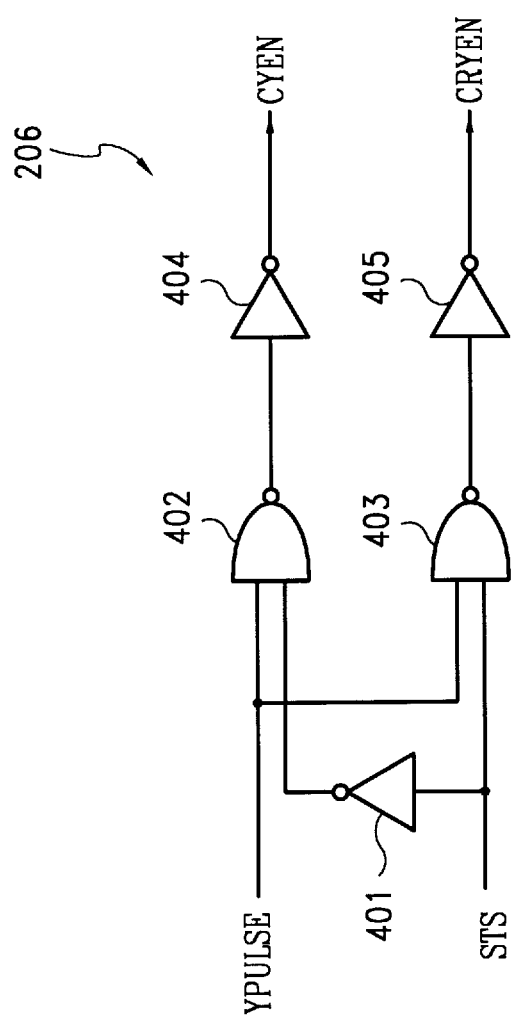
FIG. 4 describes a diagram illustrative of the detailed circuit diagram of the column redundancy status latch in FIG. 2.
Figure 5:
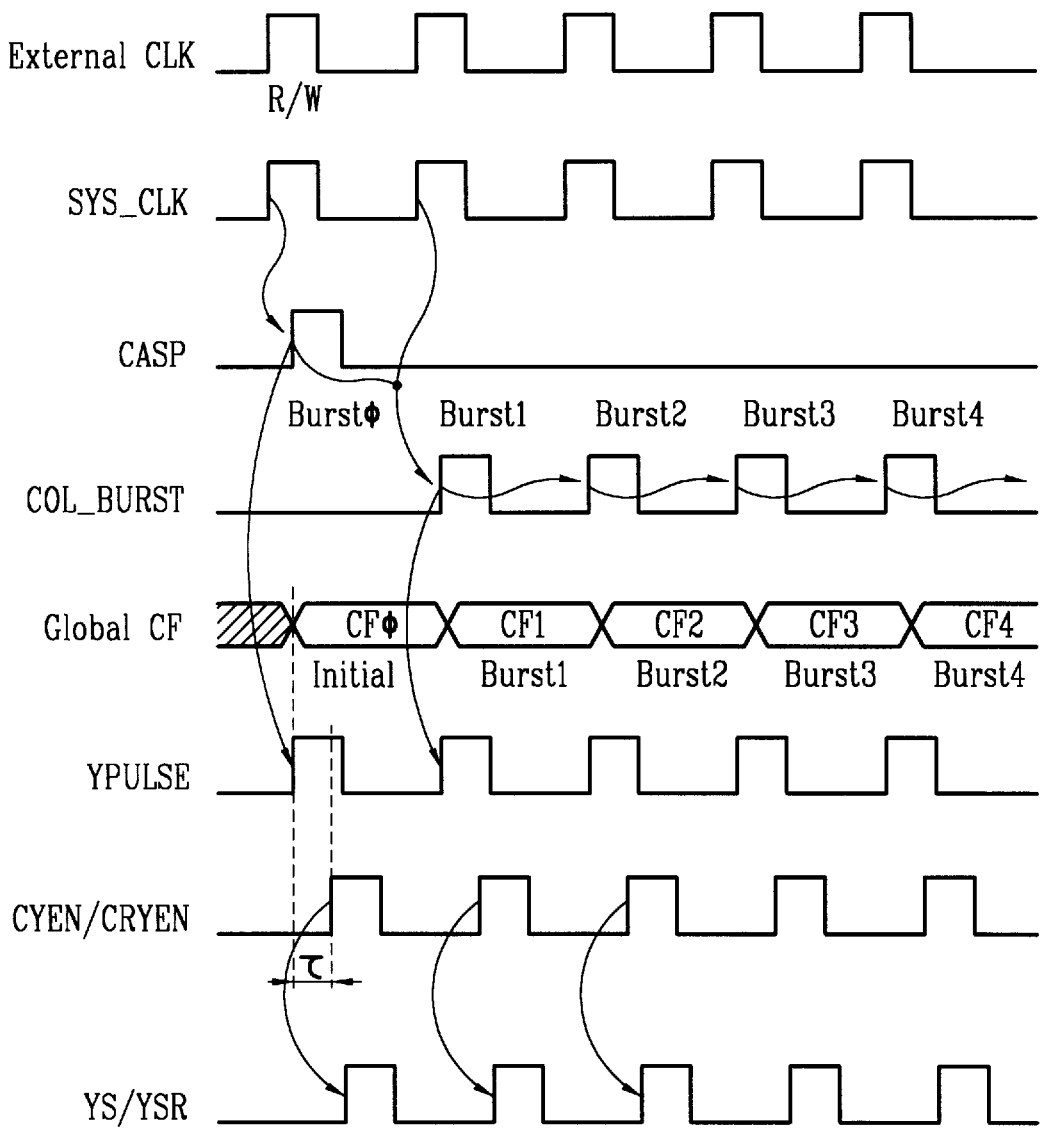
FIG. 5 represents a waveform diagram illustrative of when an external address comes to cause a read/write operation in the SDRAM circuit of FIG. 1.

Moreover, FIG. 4 discloses a detailed diagram illustrative of the configuration of the column redundancy status latch 206. Also obviously, a simple connection is made by using three inverters 401, 404, 405, and two NAND gates 402, 403 to construct the column redundancy status latch 206. YPLUSE and STS are injected to the input terminals of the NAND gate 403; however, YPULSE and the inverted phase of STS (through an inverter 401) are routed into the input terminals of the NAND gate 402. The output terminals of the NAND gates 402 and 403 are respectively coupled with the input terminals of the inverters 404 and 403, and thus respectively output CYEN and CRYEN to the local CF generator 205. Please note that the aforementioned circuits in FIGS. 3A, 3B and 4 can be modified based on applications.

Figure 1:
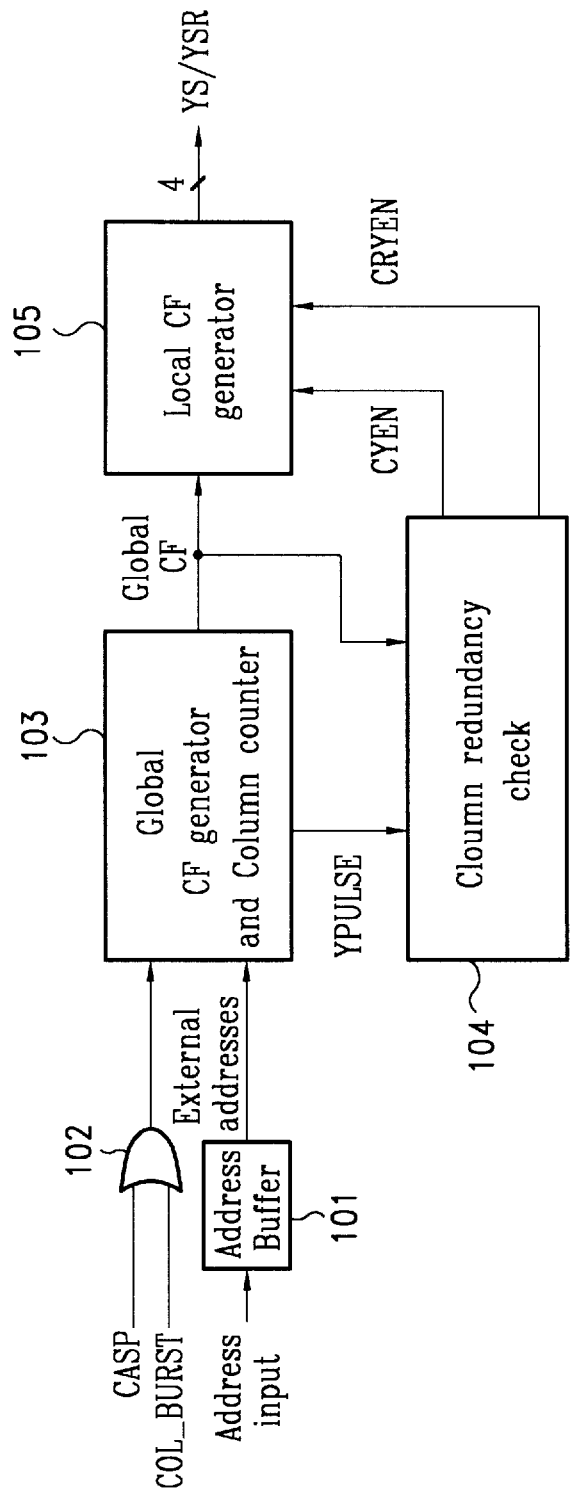
FIG. 1 represents a block diagram illustrative of the column redundancy scheme of the conventional SDRAM circuit.
Figure 6:
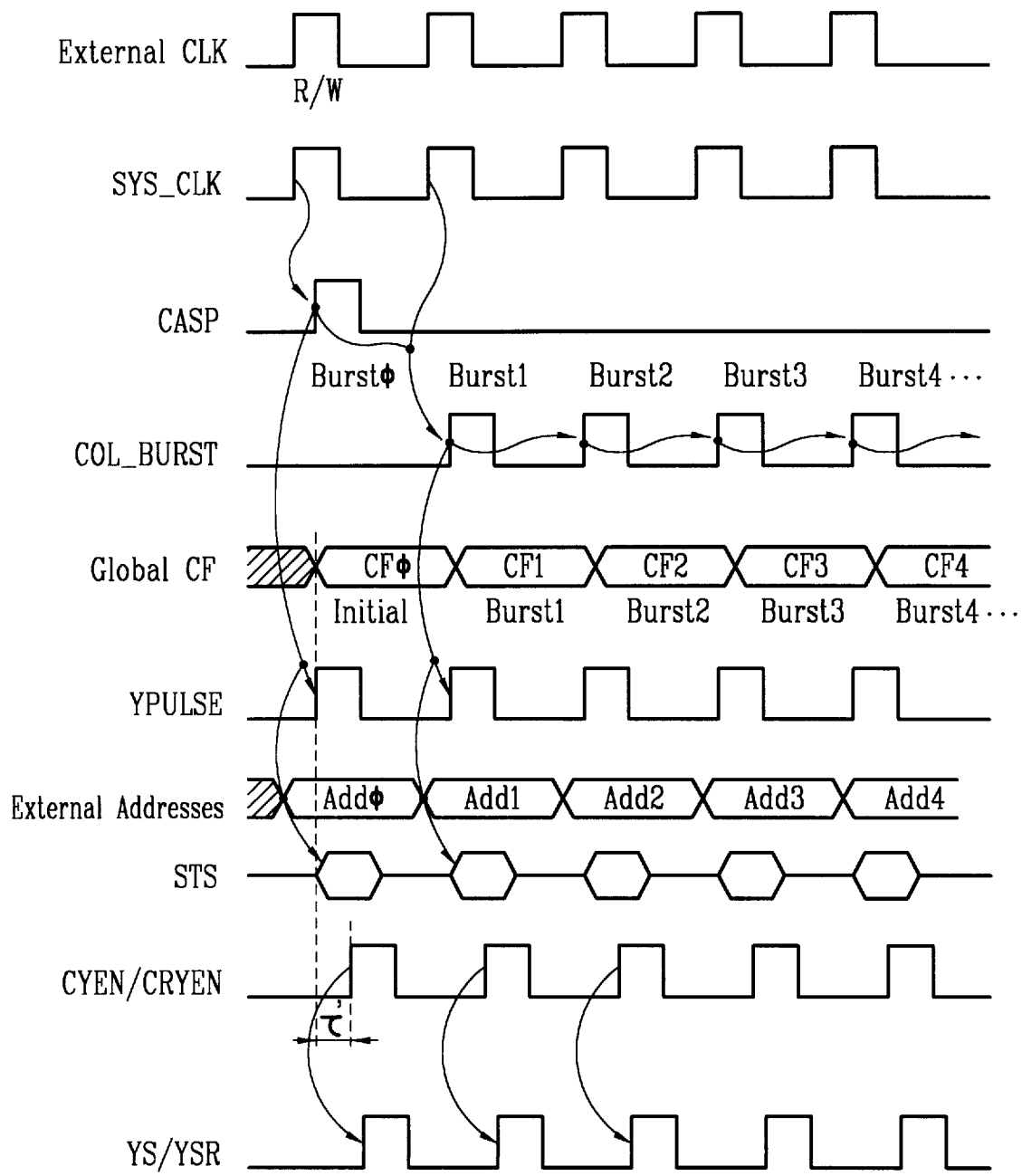
FIG. 6 demonstrates a waveform diagram representative of when an external address comes to cause a read/write operation in the present invention.

FIG. 6 describes a waveform diagram illustrative of when the external address comes to cause a read/write operation in FIG. 2. Also similar to the circuit in FIG. 1, the CASP, the global CF, and the YPULSE that start the read/write operation will appear later than the SYS_CLK and the external address. Because the column redundancy check 204 starts the redundancy evaluation as soon as the external address comes, the CYEN or the CRYEN can be routed to the local CF generator 205 while the STS arrives. Obviously, the time interval $\tau''$ of the redundancy evaluation is significantly shorter than the conventional. Accordingly, the transmission delay derived from redundancy evaluation can be almost eliminated. Furthermore, the transmission delay of the row redundancy evaluation also can be improved by using the circuit disclosed in the invention.

In conclusion, the present invention discloses a circuit that reduces the transmission delay of the redundancy evaluation for the SDRAM. An external address is firstly routed to a global column factor generator to generate a global column factor accompanied with a column address strobe pulse. The external address is also routed to a column redundancy check to evaluate whether a normal or a redundant memory cell is accessed. Therefore, the column redundancy check can perform the redundancy evaluation as soon as the external address comes, and the transmission delay that is caused by awaiting the generation of the redundancy evaluation can be significantly reduced.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A circuit for reducing a transmission delay of a redundancy evaluation in a synchronous dynamic random access memory (SDRAM), wherein said circuit comprises:

global factor generating means responsive to an external address for generating a global factor and an internal address;

redundancy evaluating means responsive to said internal address for generating a redundancy evaluation, said redundancy evaluation being output when said external address arrives;

redundancy status buffering means responsive to said redundancy evaluation for generating a path evaluation that indicates whether a redundancy memory cell is accessed; and local factor generating means responsive to said global factor and said path evaluation for generating a local factor that enables a memory accessing operation.

2. The circuit according to claim 1, wherein said redundancy evaluating means comprises:

a plurality of fuse sets for receiving said internal address and a fuse precharge signal to generate fused information that indicates a logic-state stored in said fuse set according to said internal address;

a plurality of MOS (Metal-Oxide-Semiconductor) transistors, each said MOS transistor having a gate, a source, and a drain, all said gates of said MOS transistors being used to receive said fused information, all said sources of said MOS transistors being coupled together, and all said drains of said MOS transistors being coupled together; and redundancy loading means coupled with all said drains of said MOS transistors for generating said redundancy evaluation.

3. The circuit according to claim 2, wherein each said fuse set comprises a fuse that is fusedly connected or blown to indicate whether a normal memory cell or a redundant memory cell is accessed, respectively.

4. The circuit according to claim 1, wherein said global factor generating means comprises an internal address counter for generating said internal address that enables said redundancy evaluating means to output said redundancy check evaluation.

5. The circuit according to claim 1, wherein said redundancy status buffering means couples with said redundancy status buffering means to enable said redundancy status buffering means to output said path evaluation.

6. The circuit according to claim 1, wherein said memory accessing operation is a memory-read operation or a memory-write operation.

7. The circuit according to claim 1, wherein said global factor is a global column factor or a global row factor.

8. The circuit according to claim 1, wherein said local factor is a local column factor or a local row factor.

9. A circuit for reducing a transmission delay of a redundancy evaluation in a synchronous dynamic random access memory (SDRAM), wherein said circuit comprises:

address buffering means for decoding an input address to generate an external address;

global factor generating means responsive to said external address for generating a global factor and an internal address, said global factor generating means comprises an internal address counter for generating said internal address;

redundancy evaluating means responsive to said external address and said internal address for generating a redundancy evaluation;

redundancy status buffering means responsive to said redundancy evaluation and said internal address for generating a path evaluation that indicates whether a redundancy memory cell is accessed, said redundancy status buffering means couples with said redundancy evaluation means to enable said redundancy status buffering means to output said path evaluation when said internal address arrives; and local factor generating means responsive to said global factor and said path evaluation for generating a local factor that enables a memory accessing operation.

10. The circuit according to claim 9, wherein said redundancy evaluating means comprises:

a plurality of fuse sets for receiving said internal address and a fuse precharge signal to generate fused information that indicates a logic-state according to said internal address;

a plurality of MOS (Metal-Oxide-Semiconductor) transistors, each said MOS transistor having a gate, a source, and a drain, all said gates of said MOS transistors being used to receive said fused information according to said internal address, all said sources of said MOS transistors being coupled together, all and said drains of said MOS transistors being coupled together; and redundancy loading means coupled with all said drains of said MOS transistors for generating said redundancy evaluation.

11. The circuit according to claim 10, wherein each said fuse set comprises a fuse that is fusedly connected or blown to indicate whether a normal memory cell or a redundant memory cell is accessed, respectively.

12. The circuit according to claim 9, wherein said memory accessing operation is a memory-read operation or a memory-write operation.

13. The circuit according to claim 9, wherein said global factor is a global column factor or a global row factor.

14. The circuit according to claim 9, wherein said local factor is a local column factor or a local row factor.

15. A method for reducing a transmission delay of a redundancy evaluation in a synchronous dynamic random access memory (SDRAM), said method comprising the steps of:

inputting an external address;

generating a redundancy evaluation by using said external address;

generating a global factor by using said external address;

generating an internal address by using a system clock outputting said redundancy evaluation when said internal address arrives;

generating a path evaluation by using said redundancy evaluation; and generating a local factor that enables a memory accessing operation by using said global factor and said path evaluation.

16. The method according to claim 15, wherein said path evaluation indicates whether a redundancy memory cell is accessed.

17. The method according to claim 15, wherein said memory accessing operation is a memory-read operation or a memory-write operation.

18. The circuit according to claim 15, wherein said global factor is a global column factor or a global row factor.

19. The circuit according to claim 15, wherein said local factor is a local column factor or a local row factor.

20. The method according to claim 15, wherein said redundancy evaluation is performed by detecting a fuse set indicated by said external address is fusedly connected or blown.

* * * * *